United States Patent
Chiang et al.

(10) Patent No.: US 8,796,840 B2
(45) Date of Patent: Aug. 5, 2014

(54) SEMICONDUCTOR ASSEMBLY THAT INCLUDES A POWER SEMICONDUCTOR DIE LOCATED ON A CELL DEFINED BY FIRST AND SECOND PATTERNED POLYMER LAYERS

(75) Inventors: Wan-Lan Chiang, Taipei (TW); Kuang Hann Lin, Taipei (TW); Chih-Ping Peng, Taipei (TW)

(73) Assignee: Vishay General Semiconductor LLC, Hauppauge, NY (US)

( * ) Notice: Subject to any disclaimer, the term of this patent is extended or adjusted under 35 U.S.C. 154(b) by 33 days.

(21) Appl. No.: 13/422,050

(22) Filed: Mar. 16, 2012

(65) Prior Publication Data

US 2012/0168932 A1    Jul. 5, 2012

Related U.S. Application Data (62) Division of application No. 12/939,561, filed on Nov. 4, 2010, now Pat. No. 8,138,597, which is a division of application No. 11/827,593, filed on Jul. 12, 2007, now Pat. No. 7,838,985.

(51) Int. Cl.
| | |
|---|---|
| *H01L 23/34* | (2006.01) |
| *H01L 23/10* | (2006.01) |
| *H01L 21/00* | (2006.01) |
| *H01L 23/40* | (2006.01) |
| *H01L 23/367* | (2006.01) |
| *H01L 23/433* | (2006.01) |
| *H01L 23/495* | (2006.01) |

(52) U.S. Cl.
CPC .......... *H01L 23/367* (2013.01); *H01L 23/4093* (2013.01); *H01L 2224/32245* (2013.01); *H01L 2924/12044* (2013.01); *H01L 23/49562* (2013.01); *H01L 2924/10253* (2013.01); *H01L 23/4334* (2013.01); *H01L 2224/26175* (2013.01); *H01L 2224/33181* (2013.01)

USPC .............. 257/706; 257/E23.08; 257/E21.476; 257/E23.101; 257/E23.179; 257/E23.124; 257/707; 257/676; 257/678; 257/712; 257/713; 257/704; 257/718; 257/717; 257/782; 257/762; 257/784

(58) Field of Classification Search
USPC ............ 257/707, E23.08, 782, 706, 762, 784, 257/E23.179, E23.124, E21.476, E23.101, 257/E23.087, 676, 678, 712, 713, 704, 718, 257/717; 438/122
See application file for complete search history.

(56) References Cited

U.S. PATENT DOCUMENTS

| | | | |
|---|---|---|---|
| 4,043,027 A | 8/1977 | Birchler et al. | |
| 4,504,435 A | 3/1985 | Orcutt | |

(Continued)

FOREIGN PATENT DOCUMENTS

| | | |
|---|---|---|
| JP | 2000-311905 | 11/2000 |
| KR | 2003-087739 | 7/2002 |

*Primary Examiner* — Alexander Oscar Williams
(74) *Attorney, Agent, or Firm* — Stuart H. Mayer; Karin L. Williams; Mayer & Williams PC (57) ABSTRACT

A semiconductor assembly includes a first subassembly comprising a heat sink and a first patterned polymer layer disposed on a surface of the heat sink to define an exposed portion of the first surface. The exposed portion of the first surface extends radially inward along the heat sink surface from the first layer. The subassembly also includes a second patterned polymer layer disposed on a radially outer portion of the first patterned polymer layer. The first and second layers define a cell for accommodating a power semiconductor die. Solder material is disposed on the exposed portion of the heat sink surface and in the cell. A power semiconductor die is located within the cell on a radially inward portion of the first layer and thermally coupled to the heat sink by the solder material.

9 Claims, 9 Drawing Sheets

(56) References Cited

U.S. PATENT DOCUMENTS

| | | | |
|---|---|---|---|
| 4,858,073 A | 8/1989 | Gregory | |
| 5,070,039 A | 12/1991 | Johnson et al. | |
| 5,198,964 A | 3/1993 | Ito et al. | |
| 5,311,060 A | 5/1994 | Rostoker et al. | |
| 5,989,474 A | 11/1999 | Suzuki | |
| 6,362,517 B1 | 3/2002 | Bell et al. | |
| 6,587,344 B1 | 7/2003 | Ross | |
| 6,624,522 B2 | 9/2003 | Standing et al. | |
| 6,693,349 B2 | 2/2004 | Akram | |
| 6,710,438 B2 | 3/2004 | Yeo et al. | |
| 6,757,968 B2 | 7/2004 | Lo et al. | |
| 6,784,540 B2 * | 8/2004 | Cardwell | 257/706 |
| 6,890,845 B2 | 5/2005 | Standing et al. | |
| 7,038,311 B2 | 5/2006 | Woodall et al. | |
| 7,202,111 B2 | 4/2007 | Chiu | |
| 7,527,090 B2 | 5/2009 | Dani et al. | |
| RE41,559 E * | 8/2010 | Cardwell | 257/706 |
| 7,838,985 B2 * | 11/2010 | Chiang et al. | 257/706 |
| 7,888,183 B2 * | 2/2011 | Liu et al. | 438/122 |
| 7,915,728 B2 | 3/2011 | Chiang et al. | |
| 8,003,496 B2 * | 8/2011 | Oh et al. | 438/464 |
| 8,138,597 B2 * | 3/2012 | Chiang et al. | 257/706 |
| 2004/0155325 A1 * | 8/2004 | Ma et al. | 257/678 |
| 2004/0261980 A1 | 12/2004 | Dani et al. | |
| 2005/0046035 A1 | 3/2005 | Egawa | |
| 2005/0151268 A1 * | 7/2005 | Boyd et al. | 257/778 |
| 2008/0185713 A1 | 8/2008 | Dani et al. | |
| 2008/0290378 A1 | 11/2008 | Myers et al. | |
| 2009/0014862 A1 | 1/2009 | Chiang et al. | |

* cited by examiner

SEMICONDUCTOR ASSEMBLY THAT INCLUDES A POWER SEMICONDUCTOR DIE LOCATED ON A CELL DEFINED BY FIRST AND SECOND PATTERNED POLYMER LAYERS

CROSS REFERENCE TO RELATED APPLICATION

The present application is a divisional of U.S. patent application Ser. No. 12/939,561, filed on Nov. 4, 2010, now U.S. Pat. No. 8,138,597, which is a divisional of U.S. patent application Ser. No. 11/827,593, filed on Jul. 12, 2007, now U.S. Pat. No. 7,838,985, the contents of which are incorporated herein by reference.

This application is also related to U.S. patent application Ser. No. 11/827,592 filed on Jul. 12, 2007, now U.S. Pat. No. 7,915,728, and is entitled "Subassembly That Includes A Power Semiconductor Die And A Heat Sink Having An Exposed Surface Portion Thereof," which is incorporated herein by reference in its entirety.

FIELD OF THE INVENTION

The present invention relates to mounting assemblies and packages for semiconductor devices used in electronic equipment, and more particularly to mounting assemblies and packages power semiconductor devices.

BACKGROUND OF THE INVENTION

The electronics industry has been progressing with the miniaturization of electronic devices. This trend influences semiconductor packaging technology, which enables the connection between bare IC chips and other components, and enables the connection between bare IC chips and other components. Typically, a semiconductor package has a footprint much larger than that of the chip. To adapt to the miniaturization trend, the size difference between the package and the chip has been reduced, producing a new package type called a Chip scale package (CSP). A chip scale package is loosely defined as a package that takes no more than about 20% additional area (length and width) than the bare silicon die. The solder balls of chip scale packages are smaller than ball grid array (BGA) that had arranged according to international standard of Joint Electron Device Engineering Council (JE-DEC). When it comes to personal and portable electronic devices, smaller is better, and various products need different chip scale package types, a wide array of which are currently available.

Certain semiconductor devices are designed to handle relatively high voltages in a compact space. For example, semiconductor devices that are exposed to RMS voltages greater than 100 VAC, such as 265 VAC or 415 VAC, are often mounted in electronic power supplies and the like. These devices may dissipate relatively large amounts of power, and are accordingly often mounted to heat sinks or like devices as well as being electrically connected to electronic equipment of various types.

Figure 1:
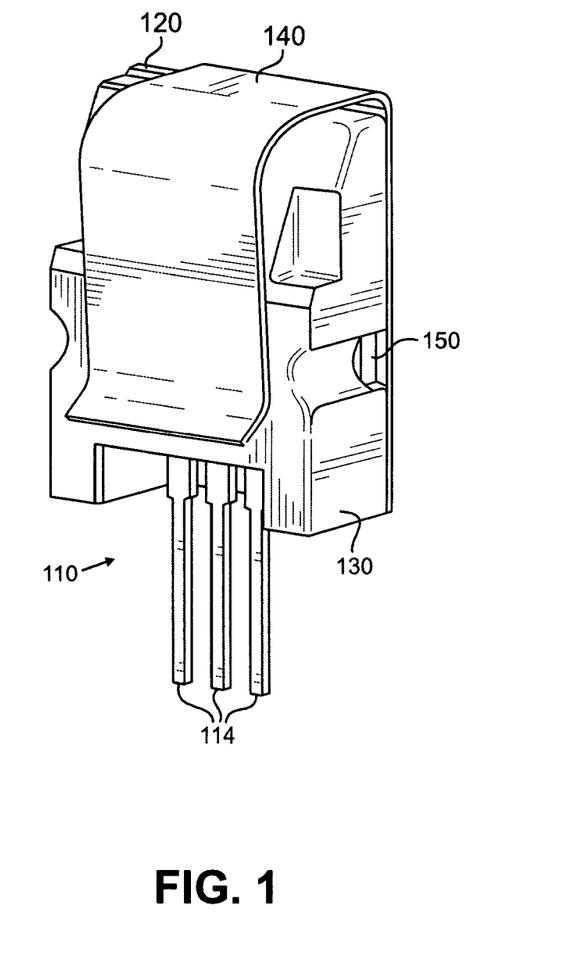
FIG. 1 shows an illustrative package for a power semiconductor die.

Many such semiconductor devices for power applications are commonly available in the JEDEC standard TO-220 and DO-218 packages (www.jedec.org). An illustrative TO-220 package 110 is shown in FIG. 1. The TO-220 package 110 includes a pressure clamp 140, retainer 130, heat sink 120, a spacer 150 interposed between the package 110 and the heat sink 120, and a semiconductor die (not visible in FIG. 1) with leads 114 exiting the package 110 on one side. High-voltage semiconductor devices may also be available in various other packages similar to the TO-220 package.

The continued emphasis on faster, smaller, lighter, and lower cost electronics systems is making component, board and system packaging more complex each year. The increase in complexity is due to wider use of finer pitch and thinner array surface mount packages, which are the key to miniaturization of electronics products. Most of the components on a typical systems motherboard for desk top computer systems remain at 1.27 and 1.00 mm pitch surface mount components with increasing use of finer pitch (0.80, 0.65, 0.50 & 0.40 mm) array styled packages. Portable systems are moving to the finer pitches at a faster rate. The component pitch and overall profile height plays a critical role in the complexity of manufacturing process. The use of finer pitch, low profile components demands assembly equipment and processes that operate with tighter specification limits. The assembly processes that demand a higher precision include: pick-and-place, solder paste-printing applications, reflow, inspection, and rework. The use of finer pitch low profile components increases the complexity, which could negatively effect yield and rework making assemblies more difficult and costly.

One aspect of the packaging process that can reduce yield is the accuracy with which the semiconductor die can be mounted to the heat sink or slug. The accuracy of this process relies primarily on the pick and place machine that is employed. In addition, another packaging aspect of the packaging process that can also reduce yield is the accuracy with which the solder thickness can be controlled.

SUMMARY OF THE INVENTION

In accordance with the present invention, a semiconductor assembly is provided. The assembly includes a first subassembly comprising a heat sink and a first patterned polymer layer disposed on a surface of the heat sink to define an exposed portion of the first surface. The exposed portion of the first surface extends radially inward along the heat sink surface from the first layer. The subassembly also includes a second patterned polymer layer disposed on a radially outer portion of the first patterned polymer layer. The first and second layers define a cell for accommodating a power semiconductor die. Solder material is disposed on the exposed portion of the heat sink surface and in the cell. A power semiconductor die is located within the cell on a radially inward portion of the first layer and thermally coupled to the heat sink by the solder material.

In accordance with one aspect of the invention, the semiconductor assembly may also include a semiconductor package in which the first subassembly, solder and die are located.

In accordance with another aspect of the invention, the semiconductor package may be is a chip scale package.

In accordance with another aspect of the invention, at least one of the first and second patterned polymer layers may include polyimide.

In accordance with another aspect of the invention, the power semiconductor die may have a footprint with a given shape and the first patterned polymer layer conforms to the given shape.

In accordance with another aspect of the invention, the semiconductor assembly may also include a second subassembly. The second subassembly may include a second heat sink and a third first patterned polymer layer disposed on a surface of the heat sink to define an exposed portion of the surface. The exposed portion of the surface extends radially inward along the second heat sink surface from the third layer. The second subassembly also includes a fourth patterned polymer layer disposed on a radially outer portion of the third patterned polymer layer The third and fourth layers define a cell for accommodating a power semiconductor die. A second solder material is disposed on the exposed portion of the second heat sink surface. The he power semiconductor die is further located within the cell on a radially inward portion of the third layer and thermally coupled to the second heat sink by the second solder material.

In accordance with another aspect of the invention, a semiconductor assembly is provided that includes a heat sink and a first patterned polymer layer disposed on a surface of the heat sink to define an exposed portion of the first surface. The exposed portion of the first surface extends radially inward along the heat sink surface from the first layer. Solder material is disposed on the exposed portion of the heat sink surface and a power semiconductor die is located on the first patterned layer and thermally coupled to the heat sink by the solder material.

DETAILED DESCRIPTION

The present invention provides a mounting system for a semiconductor device that overcomes the aforementioned limitations of prior-art mounting systems. The mounting system is particularly suitable for use with discrete power semiconductor devices such as those employed for power linear and switching applications. Examples of such devices include, without limitation, resistors, rectifiers, transistors and the like. The mounting system discussed herein may be used in connection with surface mount technology packages such as chip scale packages, for example. Examples of standardized packages that may be suitable include, without limitation, JEDEC TO-220 and DO-218 packages. In the detailed description that follows, like element numerals are used to identify like elements appearing in one or more of the figures.

Figure 2A:
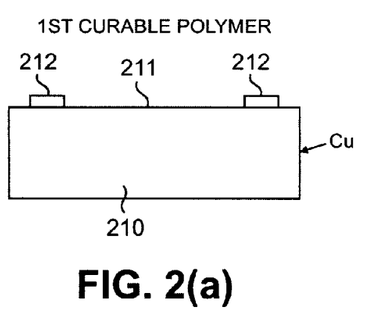
FIGS. 2(a) and 2(b) show cross-sectional and top views, respectively, of a first heat sink that is to be mounted to a semiconductor die and a first patterned polymer layer formed on the heat sink.
Figure 2B:
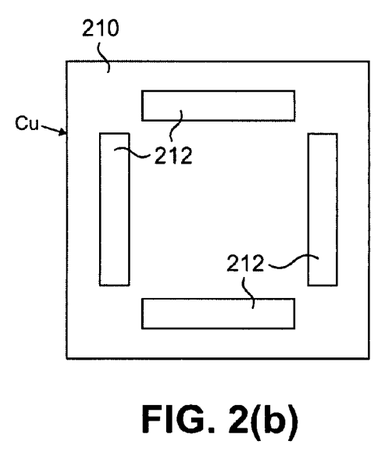
Figure 3A:
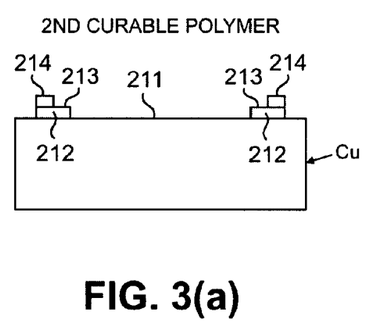
FIGS. 3(a) and 3(b) show cross-sectional and top views, respectively, of the patterned polymer layers formed on the first heat sink.
Figure 3B:
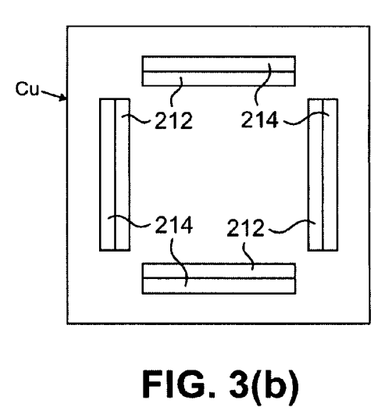
Figure 4A:
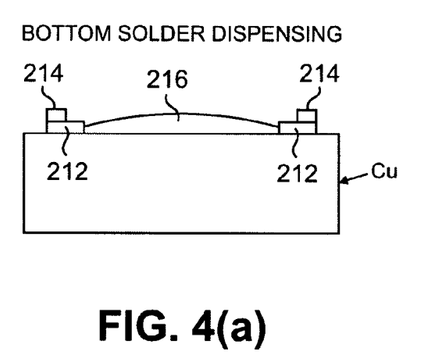
FIGS. 4(a) and 4(b) show cross-sectional and top views, respectively, of a solder material located on the surface of the first heat sink.
Figure 4B:
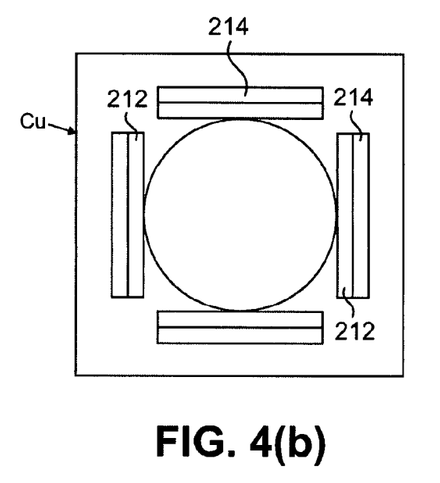
Figure 5A:
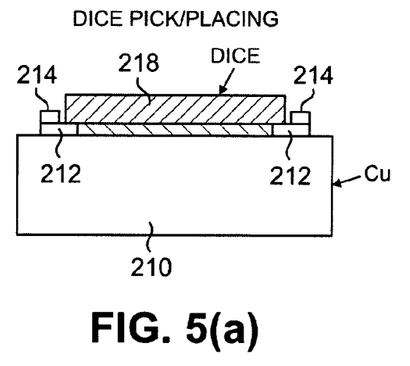
FIGS. 5(a) and 5(b) show cross-sectional and top views, respectively, of a power semiconductor die positioned on the first heat sink and contacting one of the patterned polymer layers.
Figure 5B:
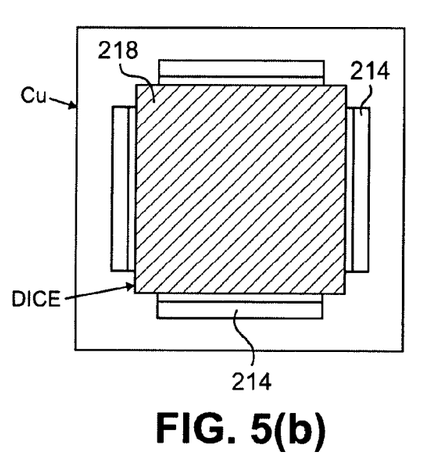

FIGS. 2(a) and 2(b) show cross-sectional and top views, respectively, of a first heat sink 210 that is to be mounted to a semiconductor die. The heat sink 210 may be formed from any suitable thermally conductive material such as, but not limited to, Cu, Al and alloys thereof. In accordance with the present invention, a curable polymer is applied to an upper surface of the first heat sink 210 and patterned using well-known stenciling and screening techniques to form a first patterned polymer layer 212. Suitable polymers include, without limitation, polymide, silicon rubber, and fluoroelastomer. The first patterned polymer layer 212 defines sidewalls of a cell 211 in which the solder can be placed. Next, in FIGS. 3(a) and 3(b), a second patterned polymer layer 214 is formed over the first polymer layer 212, again using well-known stenciling and screening techniques. The second patterned polymer layer 214 defines a border within which the die is to be situated. Exposed portions 213 of the first patterned layer 212 (i.e., those portions not covered by the second patterned layer 214) define surfaces on which the die ultimately can be mounted. As shown in FIGS. 4(a) and 4(b), after formation of the first and second patterned polymer layers, solder 216 is dispensed in a conventional manner using a syringe, for example, onto the heat sink 210 into the cell 211 that is defined by the first patterned layer 212. In FIGS. 5(a) and 5(b) a pick and place assembly machine or robot is used to position the semiconductor die 218 onto the exposed portion 213 of the first patterned layer 212. The border of the second patterned layer 214 facilitates accurate placement and alignment of the die on the heat sink 210.

Figure 6A:
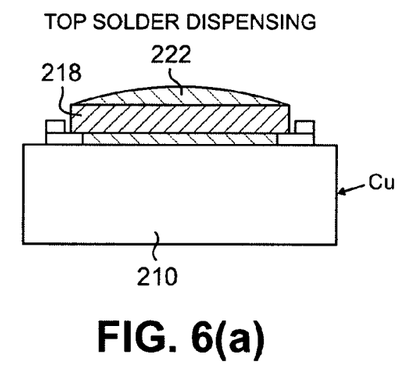
FIGS. 6(a) and 6(b) show cross-sectional and top views, respectively, of solder material applied to the exposed surface of the semiconductor die.
Figure 6B:
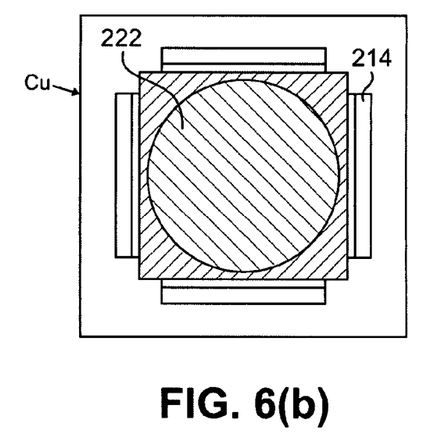
Figure 7A:
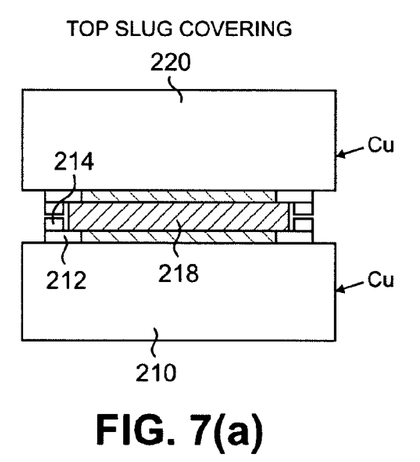
FIGS. 7(a) and 7(b) show cross-sectional and top views, respectively, of the final semiconductor assembly that includes the semiconductor die mounted to two heat sinks.
Figure 7B:
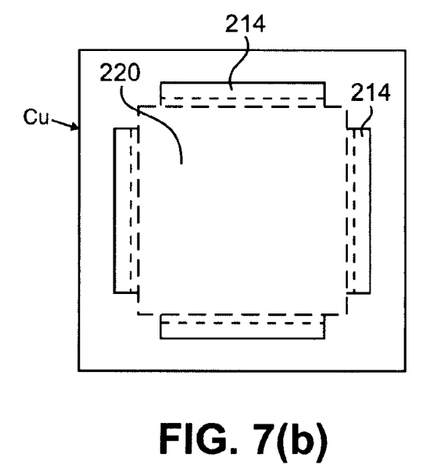

The process depicted in FIGS. 2-5 may be repeated for a second heat sink that is to contact the side of the die 218 opposing the first heat sink 210. In this case a second heat sink 220 first undergoes the process steps depicted in FIGS. 2-4 to form first and second patterned layers 212 and 214 on a second heat sink 220. Next, as shown in FIGS. 6(a) and 6(b), solder 222 is dispensed onto the exposed surface of the die 218. The second heat sink subassembly (i.e., heat sink 220 with patterned layers 212 and 214 located thereon) is then positioned over the die 218 so that the die 218 contacts the exposed surface portion of the second patterned layer 212 of the second heat sink subassembly. FIGS. 7(a) and 7(b) show cross-sectional and top views, respectively, of the final semiconductor assembly that includes the semiconductor die mounted to two heat sinks.

A number of advantages arise from the use of the mounting process depicted in FIGS. 2-7. For example, the use of a second patterned layer (e.g., second patterned layer 214) to constrain the position of the die on the heat sink limits rotational and out-of plane misalignments of the die. In this way the second patterned layer actively cooperates with the pick and place assembly machine to assist in the placement process and, as a result, the pick and place assembly machine is not solely responsible for placement of the die. In addition, the use of a first patterned layer (e.g., first patterned layer 212) that directly contacts the heat sink allows precise control of the overall solder thickness and thickness uniformity. For instance, in some cases the solder thickness in the final package can be maintained within a tolerance of about 0.25 mil to 3 mil. In addition, because the polymer that forms the first and second patterned layers is generally relatively soft and pliable, the level of stress exerted upon the die can be reduced.

To illustrate the advantages of the present invention, three samples were manufactured in accordance with the technique discussed above. The solder thickness of the samples were selected to be 55 microns, 65 microns and 75 microns, respectively. The 55 micron sample was found to vary in thickness between about 52.8 microns and 54.6 microns. The 65 micron sample was found to vary in thickness between about 64.5 microns and 69.2 microns. The 75 micron sample was found to vary in thickness between about 74.4 microns and 79.2 microns.

The size and shape of the cells 211 defined by the first and second patterned layers is not limited to those depicted in FIGS. 2-7. Rather, the size and shape of the cells can be selected as desired for different die geometries or footprints (e.g., square, hexagonal, round). The cell configuration may also be selected to comply with other factors such as flux overflow, the prevention of shorts and the like. Moreover, the sidewalls of the patterned layers 212 and 214 are not limited to the four linear segments of polymer for each of the two patterned layers that are depicted in FIGS. 2-7. Rather, any suitable configuration and number of polymer segments may be employed. For example, a square, rectangular or circular cell can be defined by a single continuous segment of polymer that has a shape defining a square, rectangle or circle, respectively. Alternatively, multiple continuous or non-continuous polymer segments may be employed in any number that is desired.

In the embodiments of the invention presented above one patterned polymer layer (e.g., patterned layer 214) is employed to constrain or control the x-y position of the die on the surface of the heat sink 210 and a second patterned polymer layer (patterned layer 212) is used to control the thickness of the solder in the z-direction. In other embodiments of the invention only one polymer layer is employed to control either the x-y position of the die or the thickness of the solder in the z-direction.

Figure 8A:
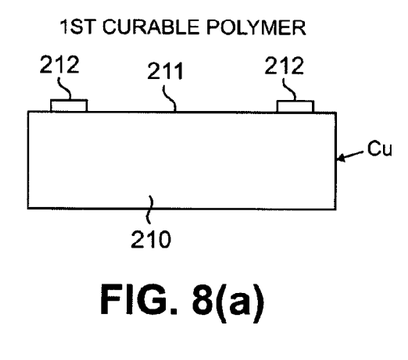
FIGS. 8(a) and 8(b) show cross-sectional and top views, respectively, of a first heat sink that is to be mounted to a semiconductor die and a first patterned polymer layer formed on the heat sink when only the x-y position of the die is to be constrained by the polymer.
Figure 8B:
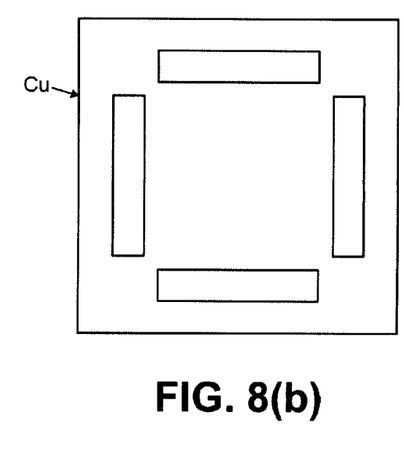
Figure 9A:
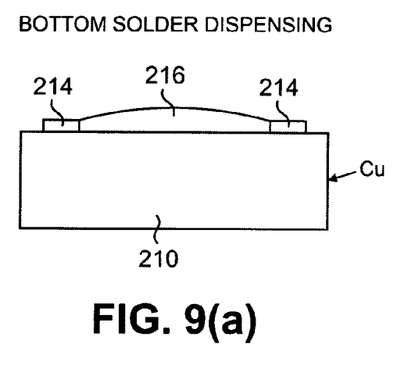
FIGS. 9(a) and 9(b) show cross-sectional and top views, respectively, of a solder material located on the surface of the first heat sink depicted in FIGS. 8(a) and 8(b).
Figure 9B:
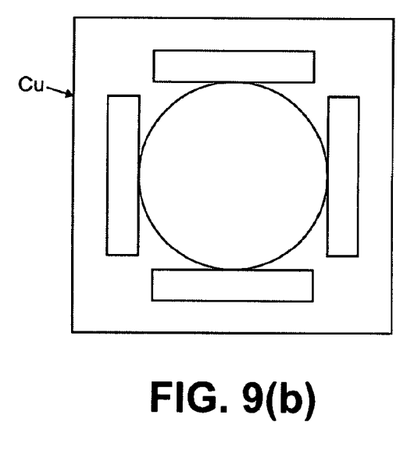
Figure 10A:
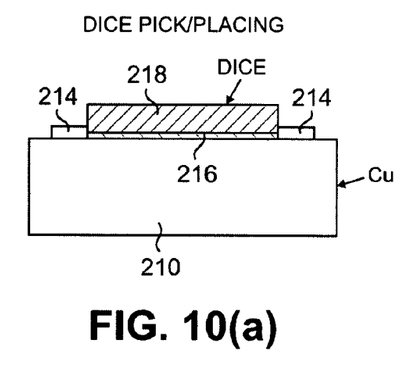
FIGS. 10(a) and 10(b) show cross-sectional and top views, respectively, of a power semiconductor die positioned on the first heat sink depicted in FIGS. 9(a) and 9(b)
Figure 10B:
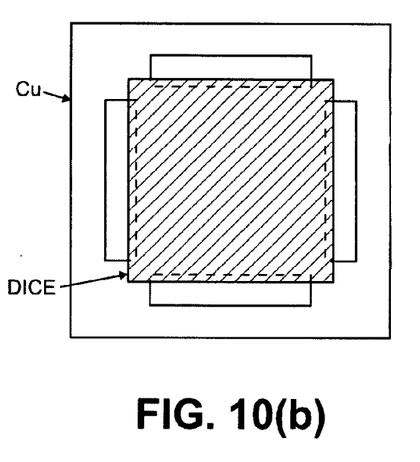

FIGS. 8-10 show an embodiment of the invention in which only a single polymer layer is employed to constrain or control the x-y position of the die on the surface of the heat sink. As shown in FIGS. 8(a) and 8(b), which once again show cross-sectional and top views, respectively, of the heat sink 210, a curable polymer is applied to an upper surface of the first heat sink 210 and patterned using well-known stenciling and screening techniques to form an orienting patterned polymer layer 214 that is used to constrain or control the x-y position of the die. The orienting layer 214 defines sidewalls of a cell 211 in which the solder can be placed. Next, in FIGS. 9(a) and 9(b), solder 216 is dispensed in a conventional manner using a syringe, for example, onto the heat sink 210 into the cell 211 that is defined by the orienting patterned layer 214. In FIGS. 10(a) and 10(b), a pick and place assembly machine or robot is used to position the semiconductor die 218 into the cell 211 so that it contacts the solder 216. The border of the orienting patterned layer 214 facilitates accurate placement and alignment of the die 218 on the heat sink 210.

Figure 11A:
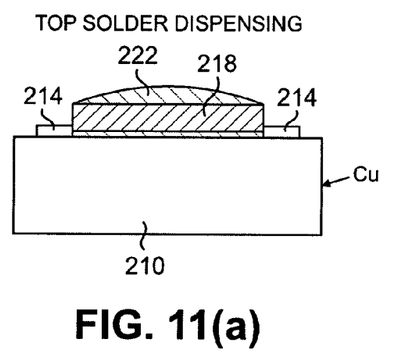
FIGS. 11(a) and 11(b) show cross-sectional and top views, respectively, of solder material applied to the exposed surface of the semiconductor die depicted in FIGS. 10(a) and 10(b)
Figure 11B:
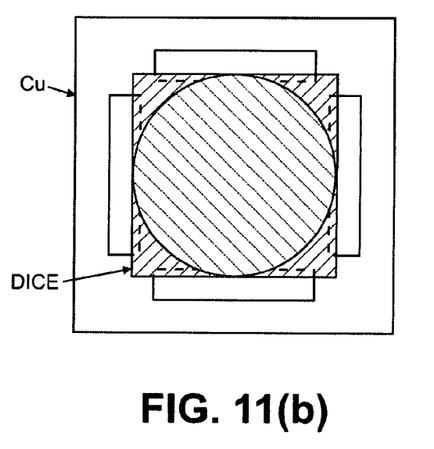
Figure 12A:
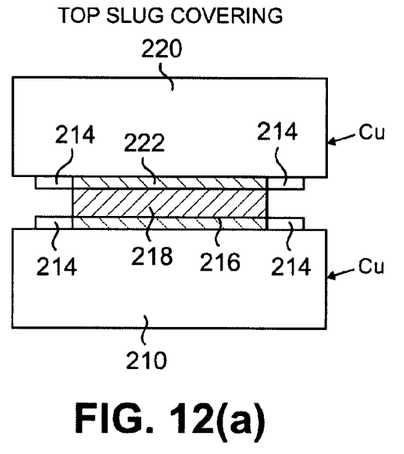
FIGS. 12(a) and 12(b) show cross-sectional and top views, respectively, of the final semiconductor assembly that includes the semiconductor die mounted to the two heat sinks referred to in connection with FIGS. 8-11.
Figure 12B:
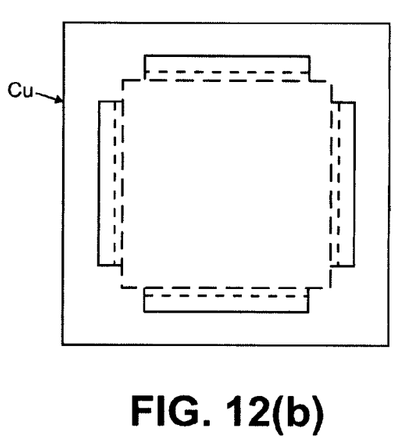

The process depicted in FIGS. 8-10 may be repeated for a second heat sink that is to contact the side of the die 218 opposing the first heat sink 210. In this case a second heat sink 220 first undergoes the process steps depicted in FIGS. 8-9 to form the orienting patterned layer 214 on a second heat sink 220. Next, as shown in FIGS. 11(a) and 11(b), solder 222 is dispensed onto the exposed surface of the die 218. The second heat sink subassembly (i.e., heat sink 220 with orienting patterned layer 214 located thereon) is then positioned over the die 218 so that the die 218 is located within the cell defined by the orienting patterned layer 214 of the second heat sink subassembly. The die 218 contacts the solder 222 of the second heat sink assembly to form the complete semiconductor assembly depicted in FIG. 12.

Figure 13A:
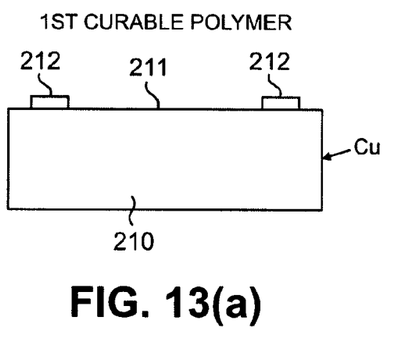
FIGS. 13(a) and 13(b) show cross-sectional and top views, respectively, of a first heat sink that is to be mounted to a semiconductor die and a first patterned polymer layer formed on the heat sink when only the solder thickness is to be controlled by the polymer.
Figure 13B:
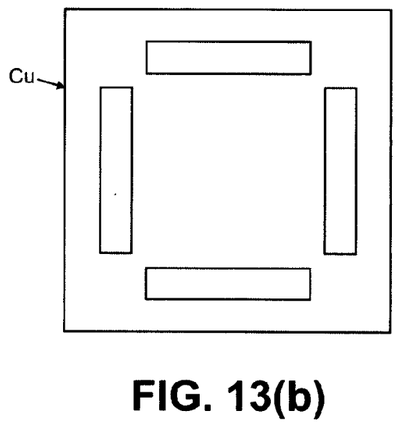
Figure 14A:
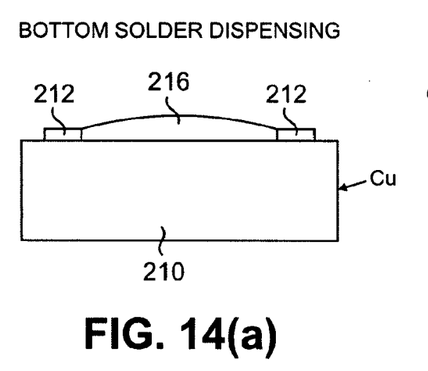
FIGS. 14(a) and 14(b) show cross-sectional and top views, respectively, of a solder material located on the surface of the first heat sink depicted in FIGS. 13(a) and 13(b).
Figure 14B:
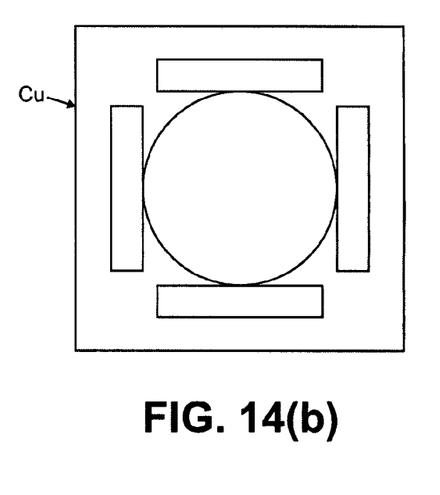
Figure 15A:
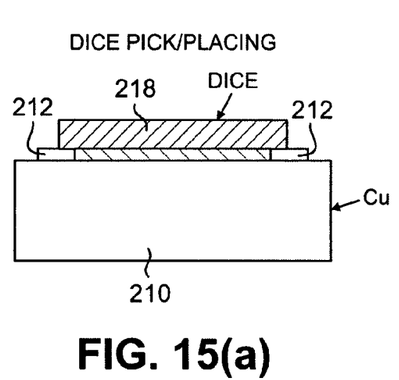
FIGS. 15(a) and 15(b) show cross-sectional and top views, respectively, of a power semiconductor die positioned on the first heat sink depicted in FIGS. 14(a) and 14(b)
Figure 15B:
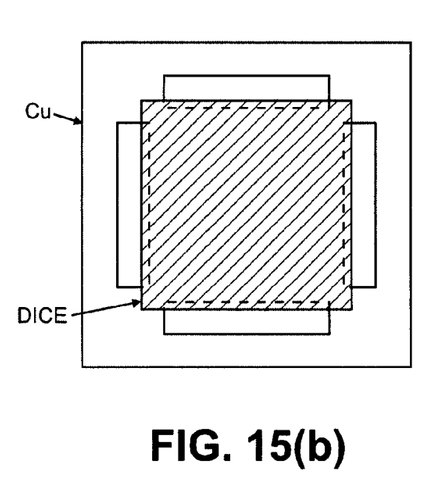

FIGS. 13-15 show an embodiment of the invention in which only a single polymer layer is employed to control the overall thickness and thickness uniformity of the solder in the z-direction. As shown in FIGS. 13(a) and 13(b), which once again show cross-sectional and top views, respectively, of the heat sink 210, a curable polymer is applied to an upper surface of the first heat sink 210 and patterned using well-known stenciling and screening techniques to form a thickness-controlling patterned polymer layer 212 that is used to control the thickness of the solder in the z direction. Next, in FIGS. 14(a) and 14(b), solder 216 is dispensed in a conventional manner using a syringe, for example, onto the heat sink 210 into the cell 211 that is defined by the thickness-controlling patterned layer 212. In FIGS. 15(a) and 15(b) a pick and place assembly machine or robot is used to position the semiconductor die 218 onto the thickness-controlling layer 212.

Figure 16A:
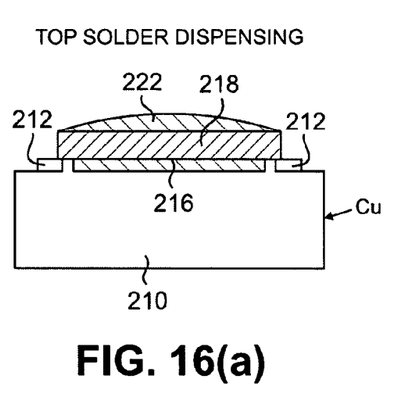
FIGS. 16(a) and 16(b) show cross-sectional and top views, respectively, of solder material applied to the exposed surface of the semiconductor die depicted in FIGS. 15(a) and 15(b)
Figure 16B:
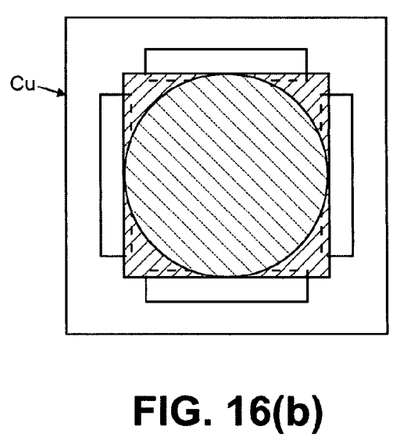
Figure 17A:
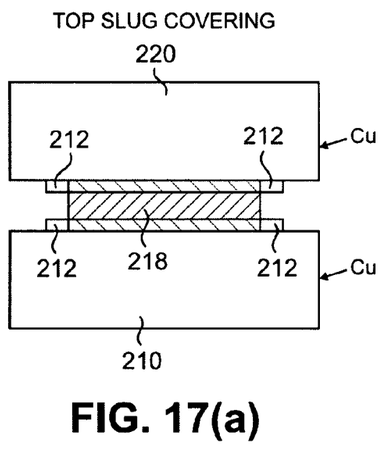
FIGS. 17(a) and 17(b) show cross-sectional and top views, respectively, of the final semiconductor assembly that includes the semiconductor die mounted to the two heat sinks referred to in connection with FIGS. 13-16.
Figure 17B:
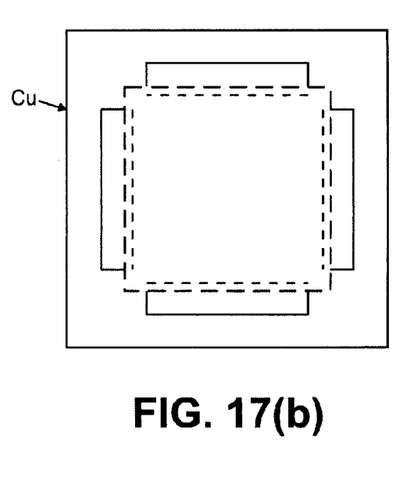

The process depicted in FIGS. 13-15 may be repeated for a second heat sink that is to contact the side of the die 218 opposing the first heat sink 210. In this case a second heat sink 220 first undergoes the process steps depicted in FIGS. 13-14 to form the thickness-controlling patterned layer 212 on a second heat sink 220. Next, as shown in FIGS. 16(a) and 16(b), solder 222 is dispensed onto the exposed surface of the die 218. The second heat sink subassembly (i.e., heat sink 220 with thickness-controlling patterned layer 212 located thereon) is then positioned over the die 218 so that the die 218 is located on the thickness-controlling patterned layer 212 of the second heat sink subassembly. The die 218 contacts the solder 222 of the second heat sink assembly to form the complete assembly depicted in FIGS. 17(a) and 17(b).

The invention claimed is:

1. A semiconductor assembly, comprising:
   a first heat sink;
   a first patterned polymer layer disposed on a surface of the first heat sink to define an exposed portion of the surface, said exposed portion of the surface extending radially inward along the first heat sink surface from the first patterned polymer layer;
   solder material disposed on the exposed portion of the surface of the first heat sink;

a power semiconductor die, a bottom surface thereof located on the first patterned polymer layer and thermally coupled to the first heat sink by the solder material;

a second heat sink;

a second patterned polymer layer disposed on a surface of the second heat sink to define an exposed portion of the surface of the second heat sink, said exposed portion of the surface extending radially inward along the surface of the second heat sink from the second patterned polymer layer, said second patterned polymer layer defining a cell for accommodating a power semiconductor die; and a second solder material disposed on a top surface of the power semiconductor die;

wherein the power semiconductor die is further located within the cell on the radially inward portion of the second patterned polymer layer, and the power semiconductor die is thermally coupled to the second heat sink by the second solder material disposed on the top surface of the power semiconductor die.

2. The semiconductor assembly of claim 1 further comprising a semiconductor package in which the first heat sink, solder and power semiconductor die are located.

3. The semiconductor assembly of claim 2 wherein the semiconductor package is a chip scale package.

4. The semiconductor assembly of claim 1 wherein the first patterned polymer layer comprises polyimide.

5. The semiconductor assembly of claim 1 wherein the power semiconductor die has a footprint with a given shape and the first patterned polymer layer conforms to the given shape.

6. A method for forming a semiconductor assembly, comprising:

forming a first patterned polymer layer on a surface of a heat sink to define an exposed portion of the surface of the heat sink, said exposed portion not covered by said first patterned polymer layer, said exposed portion of the surface of the surface of the heat sink extending radially inward from the first patterned polymer layer, said first patterned polymer layer defining a first cell for accommodating a power semiconductor die;

applying a solder material onto the exposed portion of the surface of the heat sink in the first cell;

positioning a power semiconductor die within the first cell on the surface of the heat sink extending radially inward from the first patterned polymer layer so that the power semiconductor die is thermally coupled to the heat sink by the solder material;

forming a second patterned polymer layer on a surface of a second heat sink to define an exposed portion of the surface of the second heat sink, said exposed portion of the surface second heat sink extending radially inward from the second patterned polymer layer, said second patterned polymer layer defining a second cell for accommodating a power semiconductor die;

applying a second solder material onto a top surface of the power semiconductor device; and positioning the power semiconductor die within the second cell so that the solder material on the top surface of the power semiconductor die contacts the exposed portion of the surface of the second heat sink and is thermally coupled to the second heat sink by the second solder material.

7. The method of claim 6 further comprising housing the heat sink, the first patterned polymer layer, the solder material and the power semiconductor die in a semiconductor package.

8. The method of claim 7 wherein the semiconductor package is a chip scale package.

9. The method of claim 6 wherein the power semiconductor die has a footprint with a given shape and the first patterned polymer layer conforms to the given shape.

* * * * *